United States Patent
Fischer et al.

(10) Patent No.: US 6,759,879 B2
(45) Date of Patent: Jul. 6, 2004

(54) STORAGE CIRCUIT

(75) Inventors: Helmut Fischer, Oberhaching (DE); Kazimierz Szczypinski, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/429,158

(22) Filed: May 2, 2003

(65) Prior Publication Data

US 2004/0004503 A1 Jan. 8, 2004

(30) Foreign Application Priority Data

May 2, 2002 (DE) .......................................... 102 19 652

(51) Int. Cl.⁷ .......................... H03K 17/00; H03K 3/00
(52) U.S. Cl. ............................................. 327/99; 327/299
(58) Field of Search ......................... 327/99, 291, 295, 327/298, 299, 407, 408; 713/501

(56) References Cited

U.S. PATENT DOCUMENTS 6,453,425 B1 * 9/2002 Hede et al. ................. 713/501
6,657,461 B2 * 12/2003 Jones et al. .................... 327/99
2001/0047493 A1 11/2001 Tsern et al. ................. 713/501

* cited by examiner

Primary Examiner—Tuan T. Lam
(74) Attorney, Agent, or Firm—Laurence A. Greenberg; Werner H. Stemer; Ralph E. Locher

(57) ABSTRACT

A storage circuit comprises a first clock receiver circuit for receiving an external clock signal so as to produce from said external clock signal a first internal clock signal and so as to output the first internal clock signal for use within the storage circuit, as well as a second clock receiver circuit for receiving said external clock signal and for producing from said external clock signal a second internal clock signal, said second clock receiver circuit consuming less current than said first clock receiver circuit. In addition, a circuit block is provided, which operates on the basis of said first or second internal clock signal and which is used for switching off said first clock receiver circuit when a power-down-precharge mode exists, said circuit block operating on the basis of said second internal clock signal, when the first clock receiver circuit has been switched off. A reduced current consumption can be achieved by the present invention in this way.

9 Claims, 1 Drawing Sheet

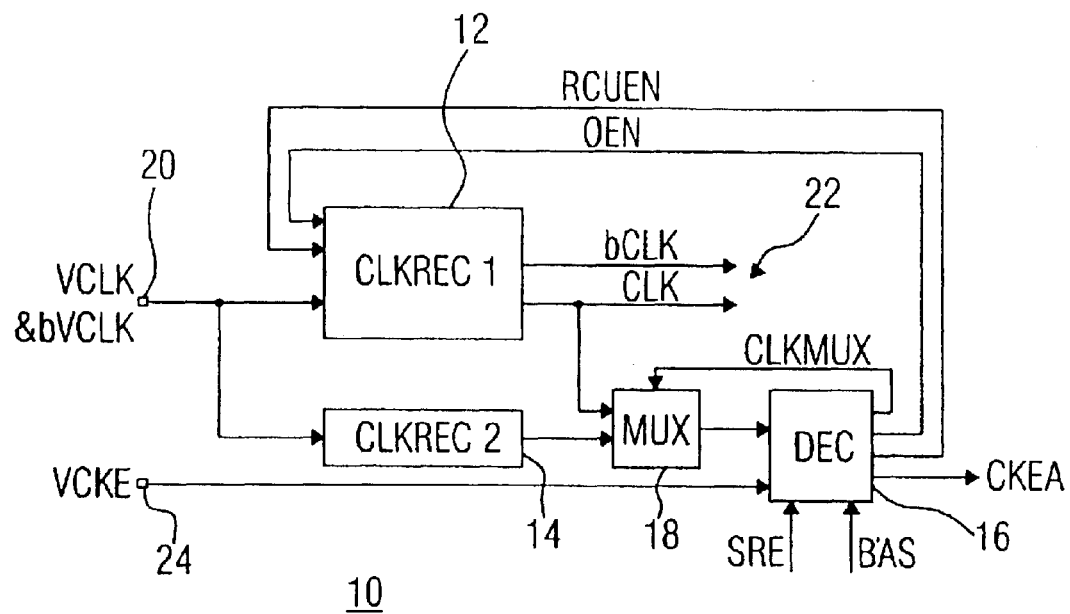

STORAGE CIRCUIT

BACKGROUND OF THE INVENTION

1. Field of the Invention

The present invention relates to storage circuits and, in particular, to storage circuits having a power-down-precharge mode.

2. Description of the Related Art

Many cases of use of storage circuits entail high demands on the energy consumption of said storage circuits, e.g. in the case of mobile phones, notebooks or other portable and self-contained devices of this type. Hence, most storage circuits, such as DDR-RAMs, SDRAM etc., have an energy-saving mode, e.g. the so-called power-down-precharge mode, in which all memory banks are inactive and most components of the storage circuit concerning the main functions of said storage circuit are switched off, said main functions being e.g. the reception, the processing and the output of read and write instructions and of the data and address signals associated therewith. For guaranteeing the minimum functions during the energy-saving mode, e.g. the discontinuance of said mode, it is also necessary to produce an internal clock signal from the external clock signal and, consequently, the clock receiver is on during the power-down-precharge mode. Due to the fact that said clock receiver is configured for high-speed applications, the current consumption is comparatively high.

SUMMARY OF THE INVENTION

It is the object of the present invention to provide a storage circuit and a method of operating the same so that the amount of energy consumed will be reduced.

The storage circuit according to the present invention comprises a first clock receiver circuit for receiving an external clock signal so as to produce from said external clock signal a first internal clock signal and so as to output the first internal clock signal for use within the storage circuit, and a second clock receiver circuit for receiving said external clock signal and for producing from said external clock signal a second internal clock signal, said second clock receiver circuit consuming less current than said first clock receiver circuit and having therefore a greater delay.

In addition, a circuit block is provided, which operates on the basis of said first or second internal clock signal and which is used for switching off said first clock receiver circuit when a power-down-precharge mode exists, said circuit block operating on the basis of said second internal clock signal, when the first clock receiver circuit has been switched off.

The invention starts from a storage circuit which comprises two clock receiver circuits of the above-mentioned type and in which, in the case of a self-refresh mode, i.e. a mode in which data are to be retained in the storage circuit and refreshed at regular intervals even if components external to the storage circuit are switched off and if no external clock signal is applied to the storage circuit, the first clock receiver circuit is switched off by a circuit block so that the circuit block, which operates on the basis of the first or of the second internal clock signal, will operate on the basis of the second internal clock signal, said circuit block operating, however, on the basis of the first internal clock signal from the first clock receiver circuit in the case of the power-down-precharge mode in this storage circuit.

The present invention is so conceived that the circuit block of the storage circuit operates on the basis of the second internal clock signal of the second clock receiver circuit also in the case of the power-down-precharge mode and switches off the first clock receiver circuit in said power-down-precharge mode. The power-down-precharge mode is an operating mode of the storage circuit in which essentially all the input buffers and the output buffers, with the exception of the two clock receivers, are deactivated. The power-down-precharge mode will be advantageous, i.e. it will save energy, especially in cases in which also the DLL is switched off, e.g. automatically upon entering the power-down-precharge mode, whereby even less current will be consumed. Up to now, this possibility has, however, not been practicable and advantageous in the final analysis, since the DLL needs a very large number of cycles, viz. approx. 200, for stabilizing. More modern DLLs recover, however, in a few, e.g. two, cycles so that, on the whole, a deactivation of the faster clock receiver is advantageous also in the power-down-precharge mode.

The present invention is based on the finding that in the power-down-precharge mode a reduced current consumption can be achieved by using, instead of the faster clock receiver circuit, i.e. the clock receiver circuit which has a shorter delay and which, due to the high speed requirements, is normally used in the other operating modes, such as reading or writing, a slower clock receiver circuit for producing the internal clock signal from the external clock signal; also said slower clock receiver circuit produces a further internal clock signal from the external clock signal, but it consumes less current and has therefore a greater delay than the first clock receiver circuit. The greater delay caused by the slower clock receiver circuit is acceptable in the power-down-precharge mode, since read and write processes are not carried out in this mode anyhow.

Preferred further developments of the present invention are the subject matter of the subclaims.

BRIEF DESCRIPTION OF THE DRAWINGS

In the following, preferred embodiments of the present invention will be explained in detail making reference to the drawings enclosed, in which:

the only FIGURE shows a block diagram of the essential part of a storage circuit according to one embodiment of the present invention.

DESCRIPTION OF THE PREFERRED EMBODIMENTS

In the FIGURE, part of a storage circuit according to one embodiment of the present invention is shown, which is generally designated by reference numeral 10 and which corresponds to the part 10 of the storage circuit responsible for the generation of the internal clock and of certain control functions during the power-down-precharge mode, as will be explained in detail hereinbelow. In addition, the storage circuit may also comprise other components, which are not shown in the FIGURE, such as memory banks in which the actual data are stored, column and store bank decoders for addressing the memory cells when they are written into or read, registers for temporarily storing various data, an instruction decoder which converts the incoming instructions into corresponding internal control signals, and the like.

The storage circuit, part of which is shown in the FIGURE, represents a DDR-RAM (DDR=Double Data Rate) which is driven by two mutually inverted external clock input signals VCLK and bVCLK. The part of the DDR-RAM shown comprises a first clock receiver 12, a second clock receiver 14, a circuit block 16 as well as a multiplexer 18. A clock input of the clock receiver 12 and a clock input of the clock receiver 14 are connected to a clock input 20 for receiving the external clock signal VCLK and the external clock signal bVCLK which is inverted relative thereto. A first clock output of the clock receiver 12 and a clock output of the clock receiver 14 are connected to two inputs of the multiplexer 18. Both clock receivers 12 and 14 produce from the external clock signals VCLK and bVCLK an internal clock signal and output said internal clock signal to the multiplexer 18, said multiplexer 18 having, however, a smaller delay than the clock receiver 14. The clock receiver 12 additionally comprises a second clock output where it outputs an internal clock signal bCLK which is inverted relative to the internal clock signal CLK generated by said clock receiver 12. As indicated by arrows at 22, both outputs of the clock receiver 12 are, for use within the DDR-RAM, connected to additional components, e.g. to an DLL (not shown) (DLL=Delay Locked Loop) for producing a clock output signal from the internal clock signals CLK and bCLK for outputting data at an output (not shown) of the DDR-RAM. One output of the multiplexer 18 is connected to a clock input of the circuit block 16.

A further input of the circuit block 16 is connected to an input 24 of the storage circuit so as to receive a signal VCKE, which is in a low logic state, if certain operating modes of the DDR-RAM exist, these operating modes including a power-down mode and a self-refresh mode, which will be explained in detail hereinbelow, whereas otherwise it will be in a high logic state. At another input, the circuit block 16 receives a self-refresh-enable (SRE) signal which is in a low logic state in the case of a self-refresh mode and in a high logic state in the case of a power-down mode, whereby the circuit block 16 will be able to differentiate between the two operating modes self-refresh mode and power-down mode. At another input, the circuit block 16 receives a signal BAS (bank-active signal) which makes known to the circuit block 16 whether a bank of the DDR-RAM is active or whether all the banks are inactive. As will be explained in detail in the following, this signal enables the circuit block 16 to differentiate between the power-down-active mode and the power-down-precharge mode, which are both power-down modes.

In addition, the circuit block 16 comprises three control outputs. A first control output is connected to a control input of the multiplexer 28 so that the circuit block 16 can control the multiplexer 18 via a signal CLKMUX in such a way that said multiplexer applies one of the two internal clock signals, viz. that of the clock receiver 12 or that of the clock receiver 14, to the clock input of the circuit block 16. The second and the third control output of the circuit block 16 are connected to a first and a second control input of the clock receiver 12 so as to activate or deactivate the clock receiver 12 via a signal RCVEN and so as to activate or deactivate the two outputs of the clock receiver 12 via a signal OEN. Another output of the circuit block 16 is provided for outputting a signal CKEA, which, as will be explained hereinbelow, represents a form of the signal VCKE which is synchronized with the internal clock signal of the clock receiver 12 or of the clock receiver 14.

The above description of the configuration of the storage circuit component 10 is now followed by a description of the mode of operation of said storage circuit component. Both clock receiver circuits 12 and 14 are provided for producing from the external clock signal VCLK and the external clock signal bVCLK, which is inverted relative thereto, an internal clock signal or, in the case of the first clock receiver 12, two mutually inverted internal clock signals. The current consumption of the clock receiver 12 is, however, higher than that of the clock receiver 14. Due to the lower current consumption of the clock receiver 14, said clock receiver 14 has a greater delay than the clock receiver 12 whose delay is e.g. in the picosecond range. As will be explained in detail in the following, the circuit block 16 will therefore deactivate the clock receiver 12 in the case of a power-down-precharge mode so as to save energy, since the storage circuit does not have to fulfil any speed-intensive tasks in this mode.

The circuit block 16 detects the existence of a power-down-precharge mode from the signals VCKE, SRE and BAS. Th signal VCKE indicates the start of a power-down mode or of a self-refresh mode by a change from a high logic state to a low logic state. The power-down mode is an energy-saving mode in which at least some of the components of the RAM, which are not shown in the FIGURE, are deactivated, such as the above-mentioned column and bank decoders or the other input buffers with the exception of the clock receivers 12 and 14. The power-down mode is divided into two types which differ insofar as either all the banks or not all the banks are inactive. A power-down-precharge mode exists when the power-down mode occurs, i.e. when the signal VCKE switches from high logic to low logic in a state in which all banks are inactive. A power-down-active mode exists, when the power-down mode occurs at a moment at which an arbitrary row in an arbitrary bank of the RAM is active. The BAS signal is e.g. a low logic state if no bank is active, and indicates the power-down-precharge mode in this way, whereas said signal BAS is in a high logic state if a row in a bank is active and indicates the power-down-active mode in this way.

The self-refresh-enable signal is used for differentiating between the power-down mode and the self-refresh mode; in the case of the self-refresh mode, said self-refresh-enable signal is in a high logic state and otherwise, or at least during the power-down mode, it is in a low logic state. In response to a self-refresh instruction, the SRE signal is adjusted from a low logic to a high logic state e.g. by an instruction decoder (not shown) of the DDR-RAM. The self-refresh instruction can be used, e.g. by a processor (not shown) connected to the DDR-RAM, so as to retain data in the DDR-RAM even if components external to the DDR-RAM, such as the processor, are switched off, i.e. inactive. When the DDR-RAM is in the self-refresh mode, data in the DDR-RAM are maintained also without external clocking by VCLK and bVCLK. The power-down mode and in particular the power-down-precharge mode differ from the self-refresh mode insofar as the RAM does not fulfil any functions during this mode and that, consequently, all the other input and output buffers, with the exception of the clock receivers 12 and 14 and with the exception of the circuit block 16, are switched off, i.e. inactive. In both operating modes, the self-refresh mode and the power-down-precharge mode, VCKE must constantly remain on a low logic value during the respective mode. During the self-refresh mode, all the other input signals may have an irrelevant value (Don't Care), whereas in the power-down-precharge mode this only applies to all the signals with the exception of the external clock signals VCLK and bVCLK, respectively. Since the DLL (not shown) will always be switched off in the self-refresh mode, the number of cycles which are necessary for the DLL to stabilize, i.e. recover, will elapse after the self-refresh mode in any case. According to one embodiment, switching off of the DLL is also effected in the power-down mode, e.g. automatically upon entering the power-down-precharge mode.

It follows that the circuit block 16 supervises the signals VCKE, SRE and BAS so as to find out whether the signal VCKE changes to a low state, and, if this is the case, the signal SRE and the signal BAS are in a low logic state. As soon as the circuit block 16 detects that the RAM is in a power-down-precharge mode, the circuit block 16 will switch off the faster clock receiver 12, i.e. it will deactivate its output, by means of the signals RVCEN and OEN. By means of the control signal CLKMUX, the circuit block 16 controls the multiplexer 18 in such a way that the circuit block 16 receives the clock signal from the slower clock receiver 14 which consumes less current. From this moment, the circuit block 16 will be driven by this clock signal so that the circuit block 16 will be able to detect whether the signal VCKE returns to a high logic state. This return of the signal VCKE means that the power-down-precharge mode is left and is detected by the circuit block 16 in clock synchronism with the clock signal of the clock receiver 14.

In the event that the circuit block 16 detects that the power-down-precharge mode is being left, said circuit block 16 will switch on the faster clock receiver 12 by means of the signal RCVEN and, subsequently, enable the outputs of the clock receiver 12 by means of the signal OEN. For a further utilization of the signal VCKE within the DDR-RAM, the circuit block 16 provides the signal CKEA. The circuit block 16 produces the signal CKEA by sampling or latching the signal VCKE with an internal clock signal, which is supplied to the circuit block 16 via the multiplexer 18.

The current consumption is reduced in the way explained hereinbefore by switching off the faster clock receiver 12 in the power-down-precharge mode. When care is taken that, during the power-down-precharge mode, the internal clock signals CLK and bCLK of the faster clock receiver 12 or clock signals derived therefrom are frozen in defined states, which permit the fastest possible reaction of the DDR-RAM when the power-down-precharge mode is being left, it will e.g. be possible to switch off the DLL, whereby even less current will be consumed. This can be achieved e.g. by a suitable unit in the circuit block 16 or the clock receiver 12 which takes care that the clock receiver 12 will not be switched off until these defined states have been reached, an additional unit taking then care that, from this moment, these states will be maintained during the power-down-precharge mode.

As has been described hereinbefore, switching off of the DLL (not shown) of the RAM can be caused automatically when a power-down mode is being entered. When the power-down mode has been left, the DLL must, of course, be activated again. A DLL which recovers in a few cycles, e.g. in two cycles, will preferably be used for this purpose. In this way, current consumption can be reduced still further.

With respect to the preceding embodiment, reference is made to the fact that the present invention can also be used for other storage types in the case of which a corresponding power-down mode exists, and that the above example referred to DDR-RAMs only exemplarily. Accordingly, the external and the internal clock signals need not be complementary signals but can also be represented by a single clock signal. In addition, there may be no multiplexer 18 or the multiplexer may be integrated in the circuit block 16. In particular, the above-mentioned logic states high and low are only exemplary states and can also be reversed. Furthermore, it would also be possible to control the circuit block by the internal clock signal and the internal clock signal inverted relative thereto.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

LIST OF REFERENCE NUMERALS 10 storage circuit component
12 clock receiver
14 clock receiver
16 circuit block
18 multiplexer
20 input
24 input

What is claimed is:

1. A storage circuit comprising
   a first clock receiver circuit for receiving an external clock signal so as to produce from said external clock signal a first internal clock signal and so as to output the first internal clock signal for use within the storage circuit;
   a second clock receiver circuit for receiving said external clock signal and for producing from said external clock signal a second internal clock signal, said second clock receiver circuit consuming less current than said first clock receiver circuit; and
   a circuit block operating on the basis of said first or second internal clock signal and used for switching off said first clock receiver circuit when a power-down-precharge mode exists, said circuit block operating on the basis of said second internal clock signal, when the first clock receiver circuit has been switched off.

2. A storage circuit according to claim 1, wherein the external clock signal consists of a first clock subsignal and a second clock subsignal which is inverted relative to the first one.

3. A storage circuit according to claim 1, wherein the first clock receiver circuit further produces a clock signal which is inverted relative to said first internal clock signal.

4. A storage circuit according to claim 1, wherein the storage circuit is a DDR-RAM.

5. A storage circuit according to claim 1, which further comprises:
   a multiplexer for supplying either the first or the second internal clock signal to the circuit block, said multiplexer being controlled by said circuit block,
   said circuit block controls the multiplexer in such a way that said multiplexer supplies to said circuit block the second internal clock signal during the power-down-precharge mode.

6. A storage circuit according to claim 1, which further comprises:
   a means for guaranteeing that during the power-down-precharge mode the first internal clock signal remains in a predetermined state permitting a faster discontinuance of the power-down-precharge mode of the storage circuit.

7. A storage circuit according to claim 1, wherein the circuit block further deactivates the output of the first clock receiver circuit in the case of the power-down-precharge mode.

8. A storage circuit according to claim 1, wherein the circuit block further detect the existence of the power-down-precharge mode from one or from a plurality of signals from which the existence or non-existence of the power-down-precharge mode can be detected.

9. A method of operating a storage circuit, said method comprising the following steps:

receiving an external clock signal, producing a first internal clock signal from said external clock signal, and outputting said first internal clock signal for use within said storage circuit by a first clock receiver circuit;

receiving said external clock signal and producing a second internal clock signal from said external clock signal by a second clock receiver circuit, said second clock receiver circuit consuming less current than said first clock receiver circuit;

switching off said first clock receiver circuit in the case of a power-down-precharge mode; and operating a circuit block of the storage circuit, which operates on the basis of the first or of the second internal clock signal, on the basis of the second internal clock signal, when the first clock receiver circuit has been switched off.

* * * * *